United States Patent [19]
Lin et al.

[11] Patent Number: 6,037,276
[45] Date of Patent: Mar. 14, 2000

[54] METHOD FOR IMPROVING PATTERNING OF A CONDUCTIVE LAYER IN AN INTEGRATED CIRCUIT

[75] Inventors: Hua-Tai Lin, Tainan; Erik S. Jeng; Liang-Gi Yao, both of Taipei, all of Taiwan

[73] Assignee: Vanguard International Semiconductor Corporation, Hsinchu, Taiwan

[21] Appl. No.: 08/958,462

[22] Filed: Oct. 27, 1997

[51] Int. Cl.⁷ .................................................. H01L 21/31
[52] U.S. Cl. ........................ 438/786; 438/706; 438/725; 438/733; 438/738; 438/742; 438/743; 438/744
[58] Field of Search ..................................... 438/706, 725, 438/733, 738, 742, 743, 744, 786

[56] References Cited

U.S. PATENT DOCUMENTS

| | | |
|---|---|---|
| 4,971,655 | 11/1990 | Stefano et al. |
| 5,639,689 | 6/1997 | Woo . |
| 5,767,018 | 6/1998 | Bell ............................................ 438/696 |
| 5,773,199 | 6/1998 | Linliu et al. ............................. 430/316 |
| 5,837,576 | 11/1998 | Chen et al. ............................... 438/253 |
| 5,856,225 | 1/1999 | Lee et al. .................................. 438/291 |
| 5,920,796 | 7/1999 | Wang et al. .............................. 438/700 |

*Primary Examiner*—David Nelms
*Assistant Examiner*—Reneé R. Berry
*Attorney, Agent, or Firm*—Christensen O'Connor Johnson & Kindness PLLC

[57] ABSTRACT

A method for improving the patterning process of a conductive layer using a dual-layer cap of oxynitride and silicon nitride. The oxynitride layer acts as a BARC (Bottom Anti-Reflective Coating) to improve photolithography process performance. The oxynitride is formed by plasma-enhanced chemical vapor deposition.

12 Claims, 4 Drawing Sheets

METHOD FOR IMPROVING PATTERNING OF A CONDUCTIVE LAYER IN AN INTEGRATED CIRCUIT

FIELD OF THE INVENTION

The present invention relates to photolithography, and more specifically, to a new anti-reflective coating used to improve lithography patterning.

BACKGROUND OF THE INVENTION

Microcircuit fabrication requires that precisely controlled quantities of impurities be introduced into tiny regions of the silicon substrate. Subsequently, these regions must be interconnect to create components and ultimately VLSI circuits. The patterns that define such regions are created by a lithographic process. As semiconductor devices become more highly integrated, the line width of VLSI circuits typically are scaled down. The semiconductor industry's drive toward integrated circuits with ever decreasing geometries, coupled with its pervasive use of highly reflective materials, such as polysilicon, aluminum, and metal silicides, has led to increased photolithographic patterning problems. Unexpected reflections from these underlying materials, during the photoresist pattering process, result in the photoresist pattern being distorted.

This problem is further compounded when the photolithography is performed in the ultraviolet (UV) or deep ultraviolet (DUV) wavelength range. The resulting patterns generated in the photoresist are easily compromised by the effects of uncontrolled reflections from the underlying materials due to the increased optical metallic nature of underlying reflective materials at these wavelengths. Therefore, the fabrication of advanced integrated circuits with submicron geometries is limited.

SUMMARY OF THE INVENTION

A method for improving lithography patterning process on conductive layer comprising the following steps: an oxynitride layer is formed on the conducting layer, a nitride layer is formed on the oxynitride layer, a photoresist layer is formed on the nitride layer, and a portion of the photoresist layer is exposed to electromagnetic radiation having the exposure wavelength less than 440 nanometers.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Figure 1A:
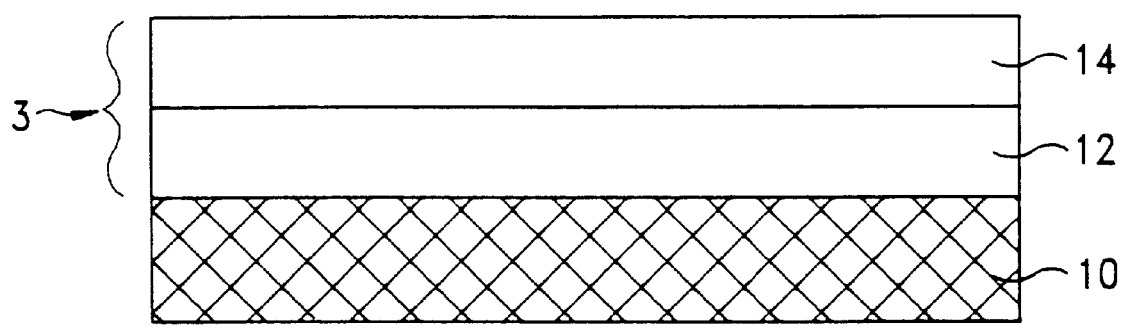
FIG. 1a is a cross-section view of dual-layer on metal or polycide containing substrate according to the present invention.

FIG. 1a shows a new dual-layer structure 3 composed of a silicon nitride layer 14 (SiN) and a oxynitride layer 12 ($SiO_xN_y$). The dual-layer structure is formed atop a metal (or polycide) layer 10. The dual-layer structure acts as a BARC.

Figure 1B:
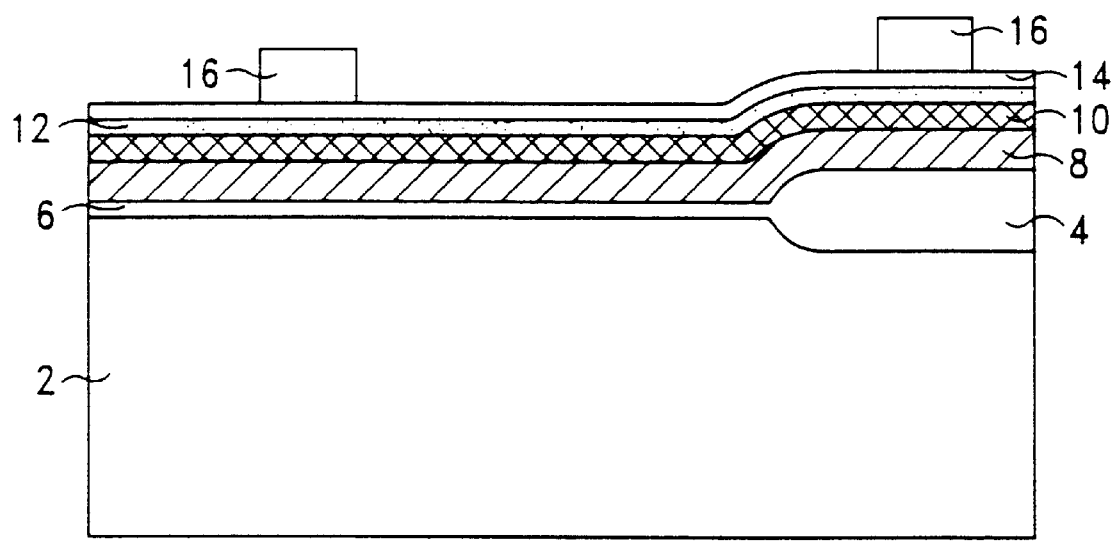
FIG. 1b is a cross-section view of BARC layer applicated to DRAM fabrication according to the present invention.

FIG. 1b illustrates specifically how the BARC of the present invention is applied to a DRAM fabrication process. At the point in the fabrication process shown in FIG. 1b, a field oxide layer 4 has been created in a p-type substrate 2. A pad oxide layer 6 has been formed on the exposed portion of the substrate. A polysilicon layer 8 has been blanket deposited on the pad oxide layer 6 and field oxide region 4. Next, a tungsten-silicide layer 10 is deposited on the polysilicon layer 8. This is followed by a blanket plasma-enhanced chemical vapor deposition or chemical vapor deposition of an oxynitride ($SiO_xN_y$) layer 12 in a range of thickness from 150 to 1000 angstroms. Next, a silicon nitride layer 14 is deposited to a thickness of 1000 to 3000 angstroms.

In this preferred embodiment, the oxynitride ($SiO_xN_y$) layer 12 acts as a BARC to improve photolithography process performance. The oxynitride layer 12 also acts as a protection layer and stress relief layer. Photoresist mask 16 can then be used to pattern transistor gates and word lines.

Figure 2B:
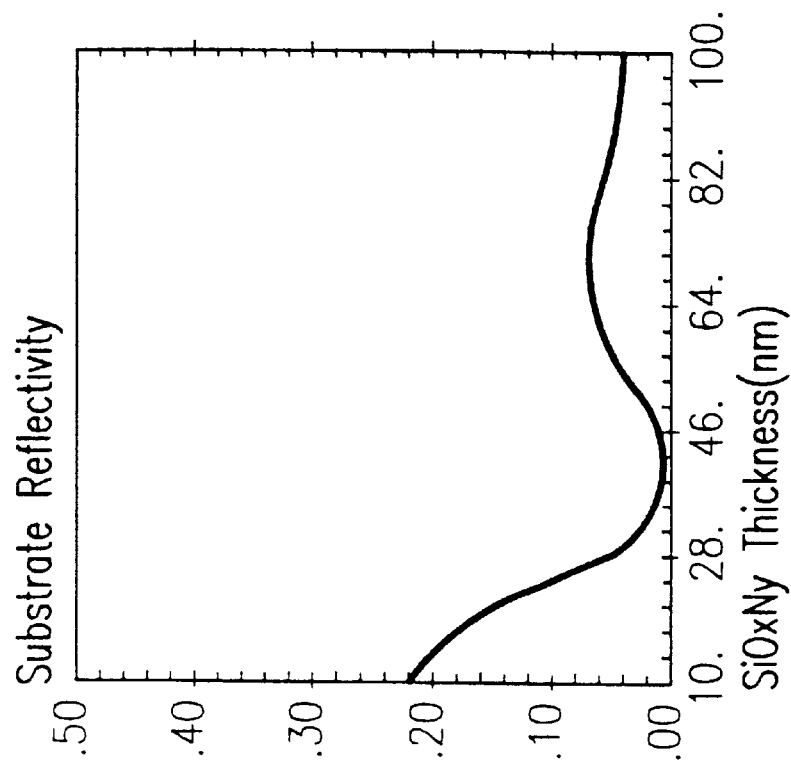
FIG. 2b is a plot of substrate reflectivity versus oxynitride thickness at 248 nm exposure wavelength using a method in accordance with the present invention.
Figure 2A:
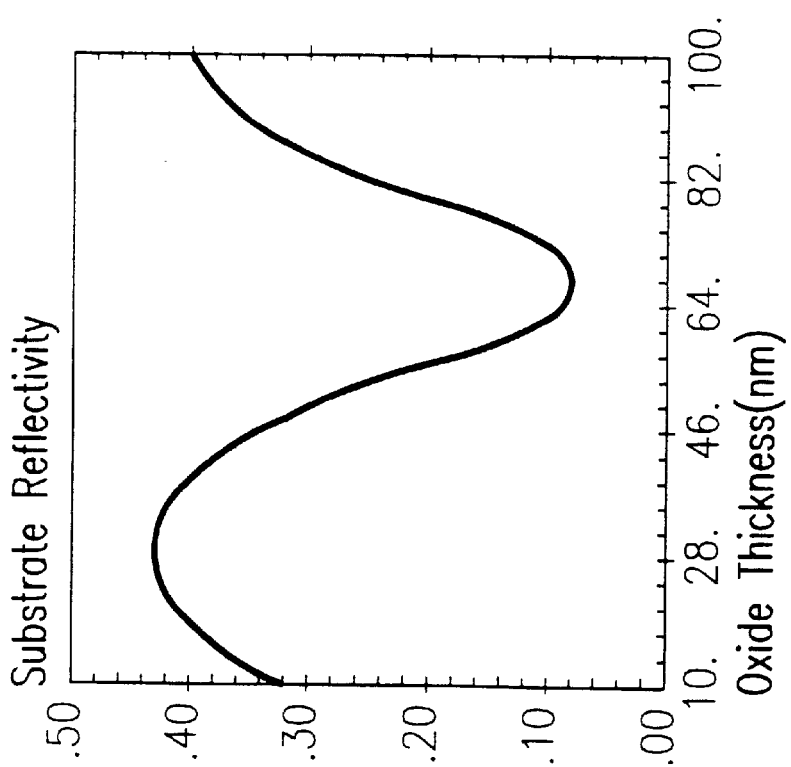
FIG. 2a is a plot of substrate reflectivity versus oxide thickness at 248 nm exposure wavelength using a method of the prior art.

Referring to FIG. 2a, a plot of the substrate reflectivity (polycide or metal) versus oxide thickness using a prior art nitride/oxide BARC is shown. The substrate reflectivity is measured at an exposure wavelength 248 nm. As can be seen from the FIGURE, the substrate reflectivity is at least 0.10.

Referring to FIG. 2b, a plot of the substrate reflectivity (polycide or metal) versus oxynitride thickness for a BARC formed in accordance with the present invention is shown. The substrate reflectivity is measured at a exposure wavelength 248 nm. The refractive index of the underlying polycide or metal substrate is 1.97, its extinction coefficient is 2.52. Preferably, the refractive index of the oxynitride layer is 2.03 and the extinction coefficient is 0.62. Preferably, the refractive index of the nitride layer is 2.25 and the extinction coefficient is 0.0188. In this embodiment, the preferred ranges for the refractive index is 1.90 to 2.20 and extinction coefficient is 0.45 to 0.65 for the oxynitride layer, the preferred ranges for the refractive index is 1.95 to 2.05 and extinction coefficient is 2.45 to 2.55 for the nitride layer. As can be seen, by using an oxynitride layer having a thickness of approximately 40 nanometers, the reflectivity of the underlying metal or polycide layer is reduced to near zero.

Figure 3B:
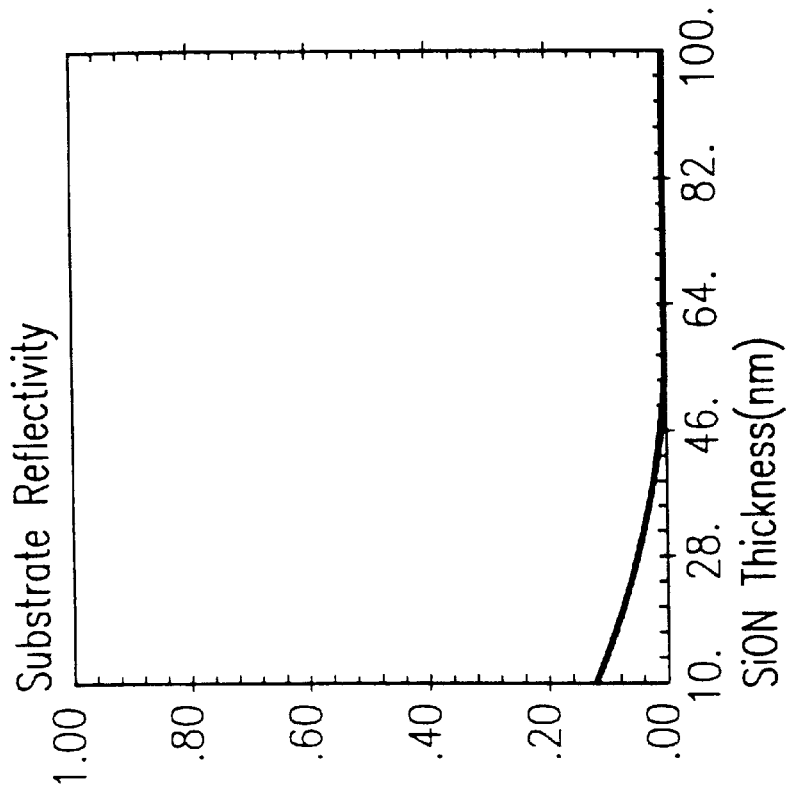
FIG. 3b is a plot of substrate reflectivity versus oxynitride thickness at 365 nm exposure wavelength using a method in accordance with the present invention.
Figure 3A:
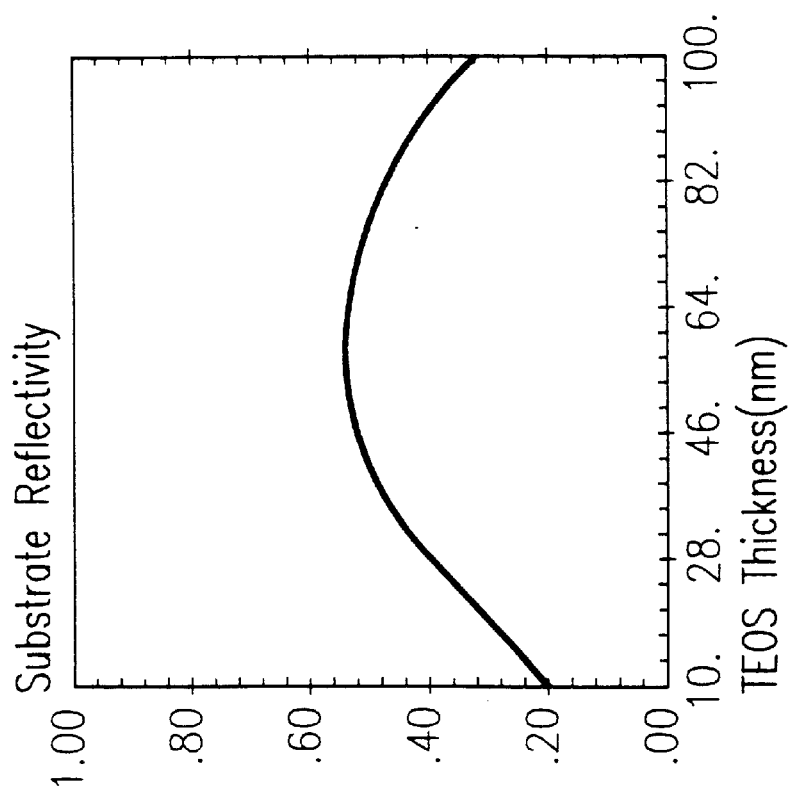
FIG. 3a is a plot of substrate reflectivity versus oxide thickness at 365 nm exposure wavelength using a method of the prior art.

Referring to FIG. 3a, a plot of the substrate reflectivity (polycide or metal) versus oxide thickness using a prior art nitride/oxide BARC is shown. The substrate reflectivity is measured at an exposure wavelength 365 nm. As can be seen from the FIGURE, the substrate reflectivity is at least 0.20.

Referring to FIG. 3b, a plot of the substrate reflectivity (polycide or metal) versus oxynitride thickness for a BARC formed in accordance with the present invention is shown. The substrate reflectivity is measured at a exposure wavelength 365 nm. The refractive index of the underlying polycide or metal substrate is 2.92, its extinction coefficient is 2.60. Preferably, the refractive index of the oxynitride layer is 2.05 and the extinction coefficient is 0.6. Preferably, the refractive index of the nitride layer is 2.05 and the extinction coefficient is 0.02. In this embodiment, the preferred ranges for the refractive index is 2.20 to 3.0 and extinction coefficient is 0.30 to 1.2 for the oxynitride layer, the preferred ranges for the refractive index is 1.95 to 2.15 and extinction coefficient is 0 to 0.5 for the nitride layer. As can be seen, by using an oxynitride layer having a thickness of over 50 nanometers, the reflectivity of the underlying metal or polycide layer is reduced to near zero.

It has been found that the oxynitride/SiN dual layer of the present invention works very well with lithography wavelengths of less than 440 nm. Further, it should be noted that the precise thickness, index of refraction, and extinction coefficient of the nitride or oxynitride layer may be easily adjusted by controlling the process parameters of the deposition. By this adjustment, we can get the preferred range of refractive index, extinction coefficient, and thickness of the oxynitride layer to improve photolithography process performance. Further, we can also improve critical dimension control during plasma etching process.

As is understood by a person skilled in the art, the foregoing preferred embodiment of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A method for improving lithography patterning process on a conductive layer comprising the steps of:

forming an oxynitride layer on said conducting layer as a first layer of a bottom anti-reflective coating (BARC);

forming a nitride layer on said oxynitride layer as a second layer of said BARC;

forming a photoresist layer on said nitride layer; and exposing a portion of said photoresist layer to electromagnetic radiation having the exposure wavelength less than 440 nanometers.

2. The method of claim 1, wherein said oxynitride layer is formed by plasma-enhanced chemical vapor deposition.

3. The method of claim 1, wherein said conductive layer is metal layer.

4. The method of claim 1, wherein said conductive is polycide layer.

5. The method of claim 1, wherein said nitride layer has a thickness of approximately 1000 to 3000 angstroms.

6. The method of claim 1, wherein said oxynitride layer has a thickness of approximately 150 to 1000 angstroms.

7. The method of claim 1 wherein said oxynitride layer has an index of refraction of about 2.03 and has an extinction coefficient of about 0.62 at an exposure wavelength of 248 nanometers.

8. The method of claim 1 wherein said nitride layer has an index of refraction of about 2.25 and an extinction coefficient of about 0.0188 at an exposure wavelength of 248 nanometers.

9. The method of claim 1 wherein said oxynitride layer has an index of refraction of about 2.05 and has an extinction coefficient of about 0.6 at an exposure wavelength of about 365 nanometers.

10. The method of claim 1 wherein said nitride layer has an index of refraction of about 2.05 and an extinction coefficient of about 0.02 at an exposure wavelength of about 365 nanometers.

11. A method for improving lithography patterning process on a conductive layer at an exposure wavelength of about 248 nanometers, said method comprising the steps of:

forming an oxynitride layer with a thickness of about 40 nanometers on said conducting layer as a first layer of a bottom anti-reflective coating (BARC);

forming a nitride layer on said oxynitride layer as a second layer of said BARC;

forming a photoresist layer on said nitride layer; and exposing a portion of said photoresist layer to the electromagnetic radiation having the exposure wavelength of about 248 nanometers.

12. A method for improving lithography patterning process on a conductive layer at an exposure wavelength of about 365 nanometers, said method comprising the steps of:

forming an oxynitride layer with a thickness of about 50 nanometers on said conducting layer as a first layer of a bottom anti-reflective coating (BARC);

forming a nitride layer on said oxynitride layer as a second layer of said BARC;

forming a photoresist layer on said nitride layer, and exposing a portion of said photoresist layer to the electromagnetic radiation having the exposure wavelength of about 365 nanometers.

* * * * *

UNITED STATES PATENT AND TRADEMARK OFFICE
CERTIFICATE OF CORRECTION

PATENT NO.   : 6,037,276                                         Page 1 of 1
DATED        : March 12, 2000
INVENTOR(S)  : H.-T. Lin et al.

It is certified that error appears in the above-identified patent and that said Letters Patent is hereby corrected as shown below:

Column 3,
Line 48, before "metal layer" insert -- a --

Column 4,
Line 1, "conductive is polycide" should read -- conductive layer is a polycide --

Signed and Sealed this

Twenty-second Day of January, 2002

Attest:

Attesting Officer

JAMES E. ROGAN
Director of the United States Patent and Trademark Office